(12) United States Patent
Mai

(10) Patent No.: US 8,035,434 B2
(45) Date of Patent: *Oct. 11, 2011

(54) SIMPLIFIED BIAS CIRCUITRY FOR DIFFERENTIAL BUFFER STAGE WITH SYMMETRIC LOADS

(75) Inventor: Tony Mai, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/750,119

(22) Filed: Mar. 30, 2010

(65) Prior Publication Data

US 2010/0182059 A1    Jul. 22, 2010

Related U.S. Application Data

(63) Continuation of application No. 11/703,634, filed on Feb. 8, 2007, now Pat. No. 7,705,642.

(51) Int. Cl.
H03L 7/06 (2006.01)

(52) U.S. Cl. ........................................ 327/158; 327/161

(58) Field of Classification Search .................. 327/158, 327/161

See application file for complete search history.

(56) References Cited

U.S. PATENT DOCUMENTS

| | | | |
|---|---|---|---|
| 4,857,763 A | 8/1989 | Sakurai et al. | |
| 4,959,563 A | 9/1990 | Schenck | |
| 5,293,082 A | 3/1994 | Bathaee | |
| 5,378,943 A | 1/1995 | Dennard | |
| 5,397,935 A | 3/1995 | Nitta | |
| 5,561,382 A | 10/1996 | Ueda et al. | |
| 5,942,940 A | 8/1999 | Dreps et al. | |
| 5,973,524 A | 10/1999 | Martin | |
| 5,999,017 A | 12/1999 | Irwin | |
| 6,249,164 B1 | 6/2001 | Cranford, Jr. et al. | |
| 6,605,997 B1 | 8/2003 | Hanson et al. | |
| 6,621,314 B2 | 9/2003 | Krishnamurty | |
| 7,233,201 B2 | 6/2007 | King et al. | |
| 7,279,949 B2 * | 10/2007 | Dreps et al. | 327/276 |
| 2006/0176096 A1 * | 8/2006 | Dreps et al. | 327/262 |
| 2007/0063687 A1 | 3/2007 | Zhou et al. | |

OTHER PUBLICATIONS

Seok-Woo Choi, Hong-June Park, "A PVT-insensitive CMOS putput driver with constant slew rate", Proceedings of 2004 IEEE Asia-Pacific Conference Advanced System Integrated Circuits (Aug. 4-5, 2004), pp. 116-119. ISBN: 0-7803-8637-X, INSPEC Accession No. 8083097.

Maneatis, John G.; Low-Jitter and Process-Independent DLL and PLL Based on Self-Biased Techniques; ISSCC96/Session 8/Digital Clocks and Latches/Paper FA8.1; Feb. 9, 1996; pp. 130-132.

Maneatis, John G.; et al.; Self-Biased High-Bandwidth Low-Jitter 1-TO-4096 Multiplier Clock Generator PLL; IEEE Journal of Solid-State Circuits, vol. 38, No. 11, Nov. 2003, pp. 1795-1803.

Golbus, Jason; Design of a 160 Mw, 1 Gigabit/Second, Serial I/O Link, Nov. 17, 1998, pp. 1-55.

* cited by examiner

*Primary Examiner* — Quan Tra

(57) ABSTRACT

A biasing circuit for biasing differential delay elements is provided. The circuit is a feedback-free circuit consisting of a CMOS output stage having a P-type transistor and an N-type transistor, with a diode connected transistor between the P-type transistor and the N-type transistor, the output stage receiving the control voltage as input, and producing the $V_{nbias}$ between the P-type transistor and the diode connected transistor. The circuit is simpler than conventional biasing circuits that employ feedback and operational amplifiers.

10 Claims, 6 Drawing Sheets

SIMPLIFIED BIAS CIRCUITRY FOR DIFFERENTIAL BUFFER STAGE WITH SYMMETRIC LOADS

RELATED APPLICATION

This application is a continuation of application Ser. No. 11/703,634, filed Feb. 8, 2007, which is hereby incorporated by reference in its entirety.

FIELD OF THE INVENTION

The present invention relates to biasing circuitry for differential buffer stages.

BACKGROUND OF THE INVENTION

A block diagram of a conventional DLL (delay-locked loop) is shown in FIG. 1. A voltage controlled delay line consisting of differential delay elements 12, 14, . . . 16 takes an input clock signal refclk 10 and delays it by a precise amount based on its bias voltages 26,28. When the DLL is locked to the reference clock, the delay of each delay element is $T_{clk}/n$, where $T_{clk}$ is the clock period, and there are n differential delay elements 12, 14, . . . , 16. The delay line produces a delayed clock dclk 18. A feedback portion of the circuit compares the delayed clock dclk 18 to the reference clock refclk 10 and produces and adjusts the bias voltages $V_{nbias}$ 26 and $V_{pbias}$ 28 such that the delay is one clock period of the input clock. To do this, the feedback portion of the circuit has a phase detector 20 that compares the phase of refclk 10 to the phase of dclk 18. If the two are the same, the bias voltages should remain as they are. If the two are out of phase, the bias voltages should increase or decrease to speed up or slow down the delay line accordingly. The phase detector 20 produces digital up or down pulses whose duration is proportional to the phase difference detected. The up and down pulses are used by the charge pump 22 to adjust a control voltage $V_{ctrl}$ 23, typically stored on a loop filter capacitor. $V_{ctrl}$ is used by the biasing circuit 24 to set the bias voltages 26, 28.

A specific example of a differential delay element is shown in FIG. 2. The amount of delay introduced into a digital waveform passing through the delay element can be controlled with the analog bias voltages. The analog bias voltages change the trip points at which the delay element changes logical state. The delay elements use a differential structure in order to increase noise rejection. Input devices M2 42, M3 44 are a differential pair which steer output current through two branches. The analog voltage $V_{nbias}$ on transistor M1 40 helps determine the delay through the delay element by controlling the total current through each branch. Devices M4 48, M5 50, M6 52, M7 54, make up two symmetric load elements 49, 51 that are used to provide a linear resistance load. Only load element 49 will be described in detail. The symmetric load 49 is made up of two PMOS devices 48, 50 connected in parallel. One device M5 50 has its gate tied to $V_{pbias}$ while the other device M4 48 is diode connected. $V_{pbias}$ also helps control the delay by determining the signal swing.

In order for the differential delay stage to operate properly, the bias voltages $V_{nbias}$, $V_{pbias}$ must be set. These voltages are derived from another voltage, $V_{ctrl}$ 23 of FIG. 1. FIG. 3 shows an example of a conventional feedback circuit for generating the bias voltages $V_{pbias}$ and $V_{nbias}$ from $V_{ctrl}$. $V_{ctrl}$ 23 is connected to an inverting input of an operational amplifier 102. The output of operational amplifier 102 is connected to the gate of transistor 104 and to the gate of transistor 114. A symmetric load 108 is connected to transistor 104 through additional transistor 106. The symmetric load 108 includes a first transistor 110 having its gate connected to a non-inverting input of the operational amplifier 102, and a second transistor 112 that is similarly connected. Transistors 114,116, 111,113 are connected in the same manner as transistors 104,106,110,112, and operate as a buffer for the output. The bias voltages are indicated at $V_{pbias}$ 28 and $V_{nbias}$ 26.

The feedback circuit of FIG. 3 generates bias voltages that have the DC behaviour illustrated in FIG. 4. FIG. 4 shows a first curve 120 for $V_{ctrl}$, a second curve 122 for $V_{pbias}$, and a third curve 124 for $V_{nbias}$.

Disadvantageously, the circuit of FIG. 3 includes significant complexity, in particular including operational amplifier 102 which in itself includes many transistors not shown in detail.

SUMMARY OF THE INVENTION

According to one broad aspect, the invention provides a biasing circuit comprising: an input for receiving a control voltage 23, and a $V_{nbias}$ output 26 for outputting a $V_{nbias}$ voltage comprising: a feedback-free circuit 200,202,204 that produces the $V_{nbias}$ voltage from the control voltage such that the $V_{nbias}$ voltage is near one $V_{DD}$ over a first control voltage range, sharply declines over a second control voltage range that follows the first control voltage range, and less sharply declines in a substantially linear manner over a third control voltage range that follows the second control voltage range.

In some embodiments, the feedback-free circuit comprises: a pull-up network 200 for pulling up the $V_{nbias}$ voltage when the control voltage is low; a pull-down network 204 for pulling down the $V_{nbias}$ voltage when the control voltage is high; and a variable resistive element 202 for impeding the pull-down network from pulling down the $V_{nbias}$.

In some embodiments, the first voltage range is from about 0.0V to about 0.2V, the second voltage range is from about 0.2V to about 0.4V, and the third voltage range is a range above about 0.4V.

In some embodiments, each of the voltage ranges is a respective range between 0 and $V_{DD}$.

In some embodiments, the feedback-free circuit comprises: a CMOS output stage having a P-type transistor 150 and an N-type transistor 152, with a diode connected transistor 154 between the P-type transistor and the N-type transistor, the output stage receiving the control voltage as input, and producing the $V_{nbias}$ between the P-type transistor and the diode connected transistor.

In some embodiments, the biasing circuit further comprises: $V_{pbias}$ output 28 for outputting a $V_{pbias}$ voltage; a direct connection between the input and the $V_{pbias}$ output.

In some embodiments, a delay locked loop comprises: a delay line comprising a plurality of differential delay elements 12,14,16; the biasing circuit is connected to provide the $V_{pbias}$ voltage and the $V_{nbias}$ voltage as biasing inputs to the differential delay elements.

According to another broad aspect, the invention provides a method of biasing comprising: receiving a control voltage and outputting a $V_{nbias}$ voltage; producing the $V_{nbias}$ voltage in a feedback-free manner from the control voltage such that the $V_{nbias}$ voltage is near one $V_{DD}$ over a first control voltage range, sharply declines over a second control voltage range that follows the first control voltage range, and less sharply declines in a substantially linear manner over a third control voltage range that follows the second control voltage range.

In some embodiments, the first voltage range is from about 0.0V to about 0.2V, the second voltage range is from about 0.2V to about 0.4V, and the third voltage range is a range above about 0.4V.

In some embodiments, each of the voltage ranges is a respective range between 0 and $V_{DD}$.

In some embodiments, the method further comprises outputting a $V_{pbias}$ voltage that tracks the control voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
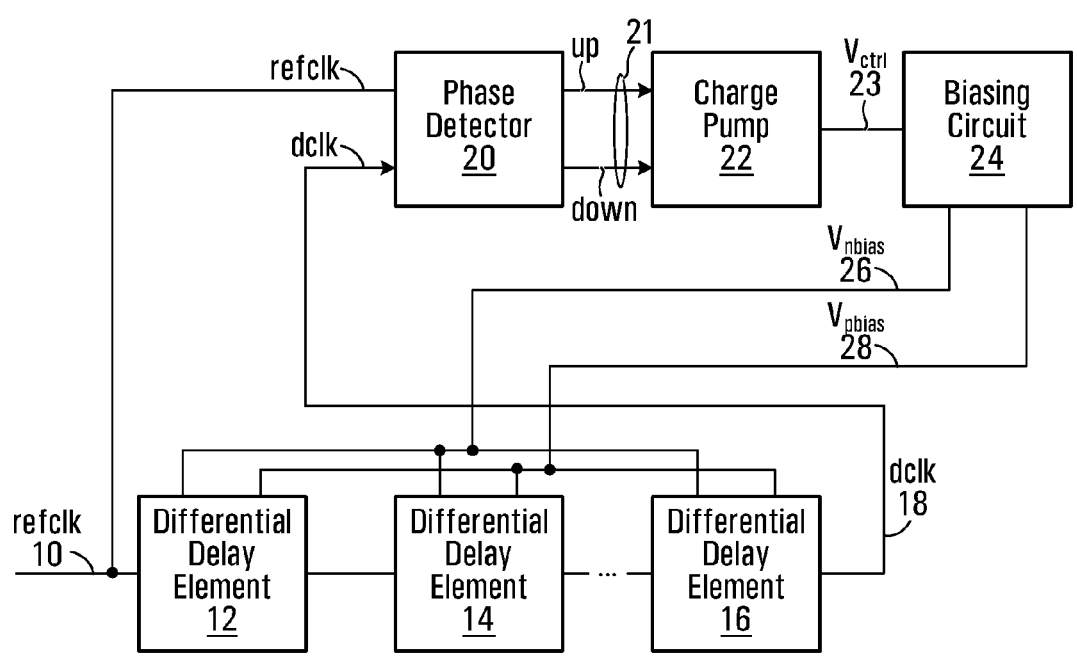
FIG. 1 is a block diagram of a delay locked loop.
Figure 2:
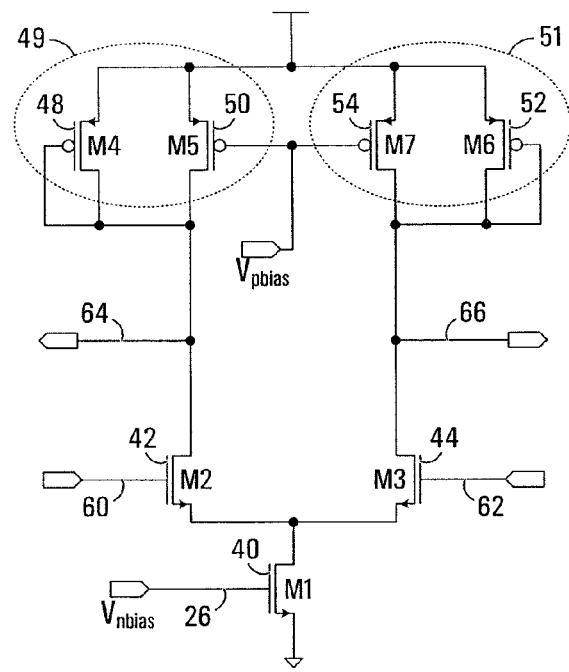
FIG. 2 is a schematic diagram of an example of a delay element.
Figure 5:
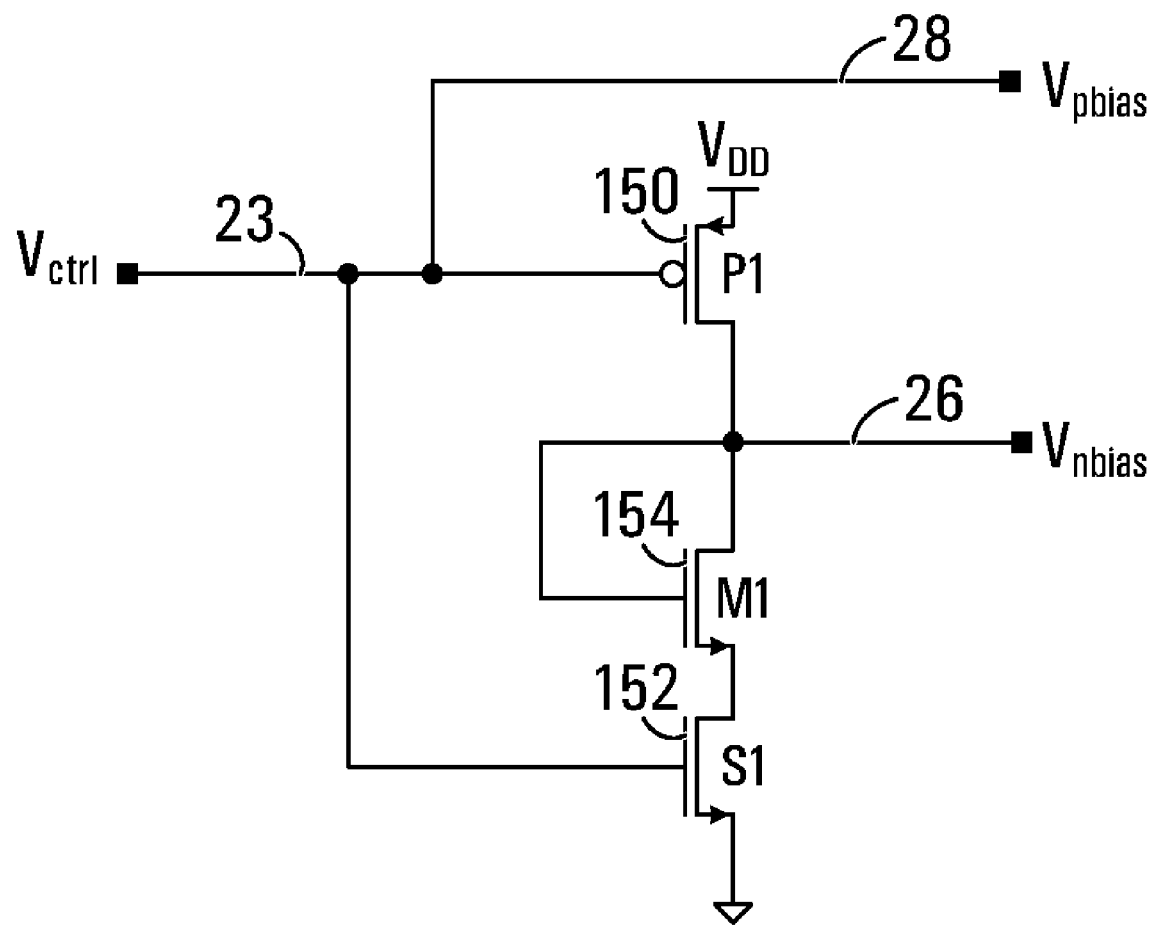
FIG. 5 is a schematic diagram of a biasing circuit provided by an embodiment of the invention.

FIG. 5 is a schematic diagram of a biasing circuit provided by an embodiment of the invention. The biasing circuit of FIG. 5 will be described in the context of its application in providing biasing voltages to the delay element of FIG. 2. However, it is to be understood that the biasing circuit may find application to providing biasing voltages to other delay element designs. This circuit also takes the input $V_{ctrl}$ 23 and produces biasing voltages $V_{pbias}$ 28 and $V_{nbias}$ 26. The circuit directly connects the input voltage $V_{ctrl}$ 23 to $V_{pbias}$ 28. $V_{ctrl}$ 23 is also connected to the gate of transistor P1 150 and the gate of transistor S1 152. Transistor P1 150 is connected to transistor S1 152 through diode connected transistor M1 154. Transistor P1 150 is also connected to a supply voltage $V_{DD}$. The bias voltage $V_{nbias}$ 26 is taken at the drain of transistor M1 154. Transistor 51 may be implemented with a size larger than that of M1 to accommodate the current generated by M1.

Figure 3:
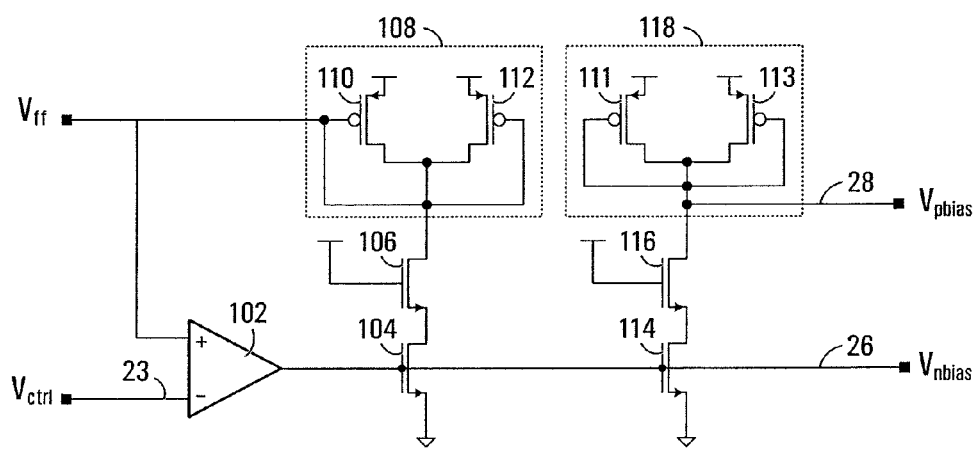
FIG. 3 is a schematic diagram of an example of a biasing circuit.
Figure 4:
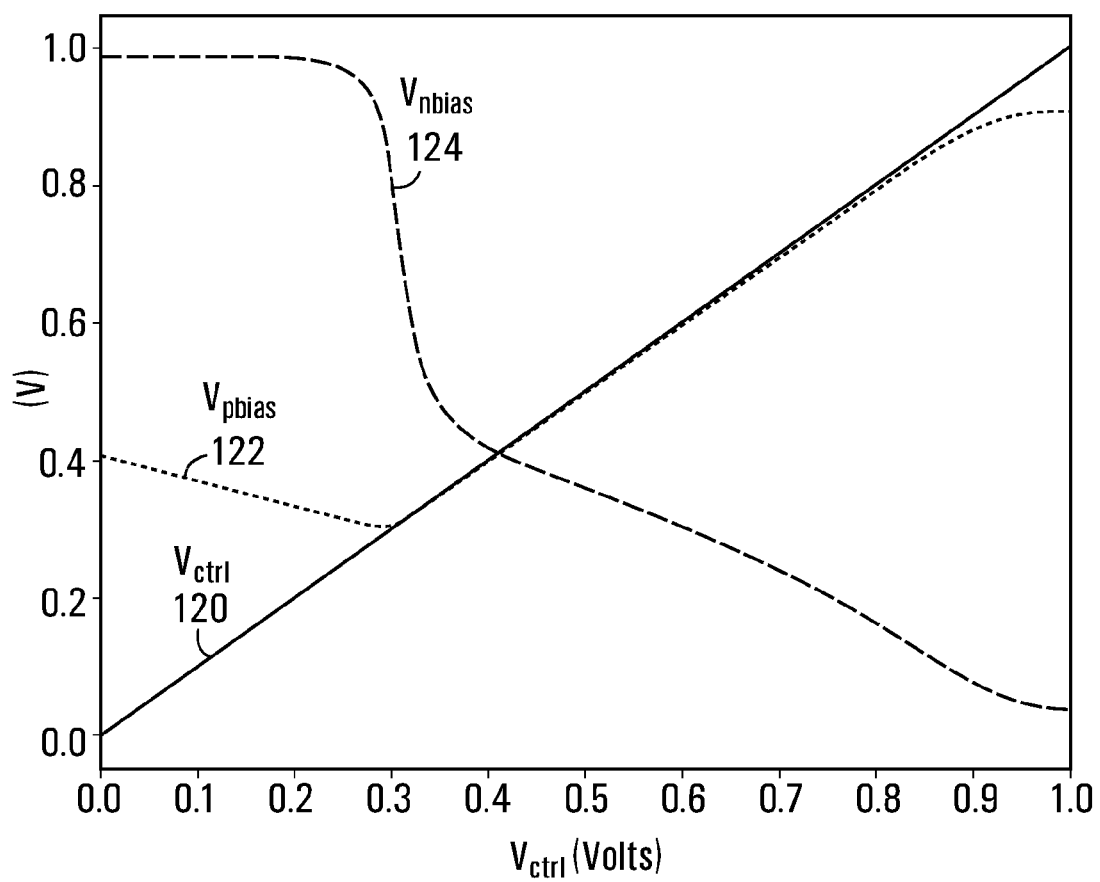
FIG. 4 is a graph showing various voltages produced by the biasing circuit of FIG. 3.
Figure 6:
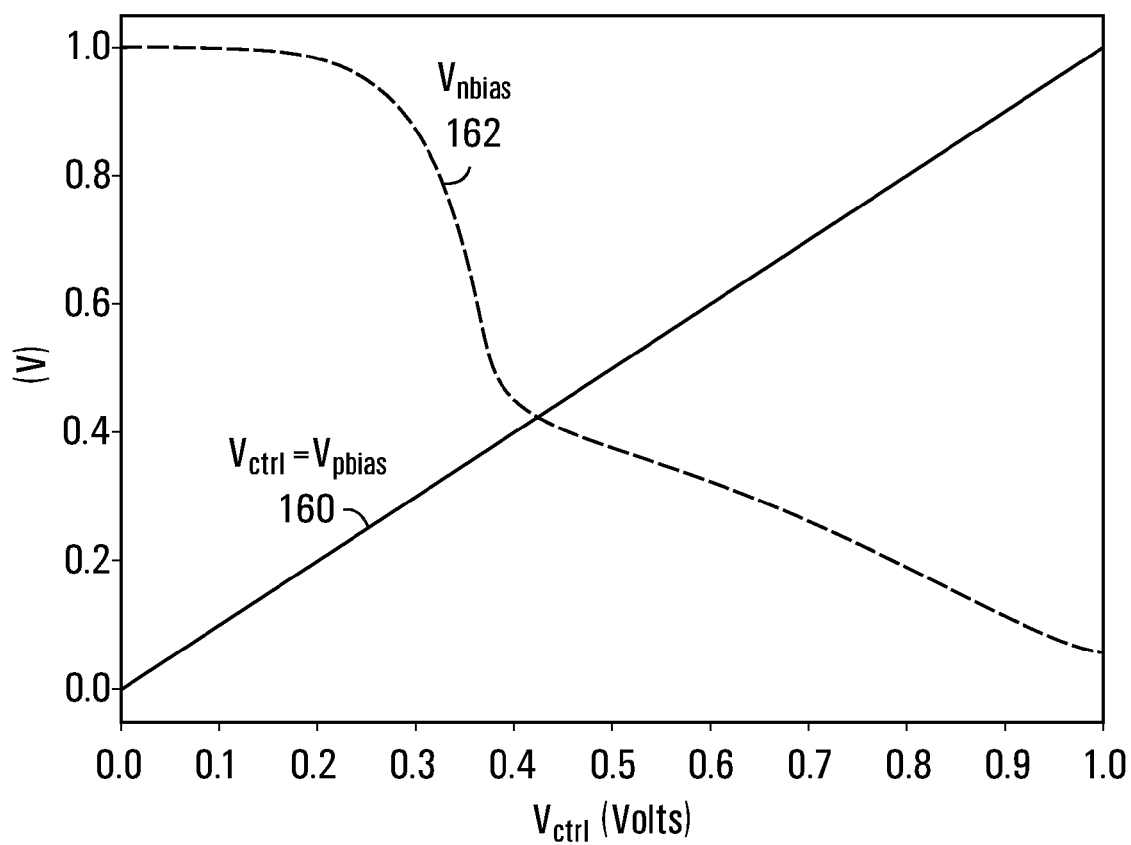
FIG. 6 is a graph showing various voltages produced by the biasing circuit of FIG. 5.

The purpose of this circuit is to mimic the DC behaviour of the biasing circuit of FIG. 3. With reference to FIG. 4, when $V_{ctrl}$ is between 0.3V and 0.9V if can be seen that $V_{ctrl}$ and $V_{pbias}$ are approximately equal. With reference back to FIG. 5, this behaviour is reproduced by a direct connection between $V_{ctrl}$ 23 and $V_{pbias}$ 28. Operation of the circuit for other values of $V_{ctrl}$ will result in different behaviour than that shown in FIG. 4. The remaining circuitry of FIG. 5 is for producing a $V_{nbias}$ that mimics the behaviour of $V_{nbias}$ shown in FIG. 4 for the circuit of FIG. 3. The behaviour of the circuit of FIG. 5 is shown in FIG. 6. Shown are curves 160 for $V_{ctrl}=V_{pbias}$, and 162 for $V_{nbias}$.

It is noted that a biasing circuit that produces only $V_{pbias}$ 28 is also contemplated. The control voltage $V_{ctrl}$ 23 might for example be directly connected to the $V_{pbias}$ inputs of the differential delay elements, or the $V_{pbias}$ inputs might be generated in some other manner.

In operation, as $V_{ctrl}$ rises, transistor 51, which is selected for its switching characteristics, starts to turn on, and transistor P1 150 starts to turn off. This starts to pull down the voltage $V_{nbias}$. When transistor S1 152 is completely on, transistor P1 150 will be completely off and $V_{nbias}$ will then be very close to zero volts (or $V_{SS}$). Between approximately 0.2 volts and 0.4 volts the transistor S1 is transitioning from being completely off to being partially on. During this period, the transistor P1 150 and the switch S1 152 are both trying to pull $V_{nbias}$ in one way or the other, but outside of that range, S1 overtakes P1. The result is that, again referring to FIG. 6, $V_{nbias}$ drops sharply between 0.2 and 0.4 volts, and then levels off to a more moderate rate of decline between 0.4 volts and 1.0 volts.

It can be seen that the curve 162 for $V_{nbias}$ in FIG. 6 is very similar to the curve for $V_{nbias}$ 124 in FIG. 4. Furthermore, the curve for $V_{pbias}$ in FIG. 6 is the same as curve 122 for $V_{pbias}$ in FIG. 4 over the range of 0.3 through 0.9 volts.

The bias voltages $V_{pbias}$, $V_{nbias}$ together define the voltage swing at the output of the differential delay element. The effect of the inaccuracy in $V_{pbias}$ between 0.2 volts and 0.3 volts is that the voltage will swing a little bit lower, and the swing will be non-symmetric. The assumption is that the circuits operation is non-critical below 0.3 volts. Setting $V_{pbias}$ sets the swing.

In more general terms, the biasing circuit includes a complementary MOS output stage (P1 150, S1 152) with a diode-connected transistor 154 in series between the two complementary transistors. However, the transistor 154 clearly makes the operation very different from that of a standard CMOS output stage, which would have a steep transition between high and low states of the output voltage as the control or input voltage is changed.

More generally still, a feedback-free circuit is provided that produces the $V_{nbias}$ voltage from the control voltage such that the $V_{nbias}$ voltage is near a supply voltage $V_{DD}$ over a first control voltage range, sharply declines over a second control voltage range that follows the first control voltage range, and less sharply declines in a substantially linear manner over a third control voltage range that follows the second control voltage range. In some implementations, $V_{DD}$ is about 1V, and the first voltage range is from about 0V to about 0.2V, the second voltage range is from about 0.2V to about 0.4V, and the third voltage range is a range above about 0.4V. These ranges are process and design dependant. In some implementations, the ranges are a function of $V_{DD}$, for example 0 to 0.2 $V_{DD}$, 0.2 $V_{DD}$ to 0.4 $V_{DD}$ and above 0.4 $V_{DD}$. Another specific example is 0 to 0.3 $V_{DD}$, 0.3 $V_{DD}$ to 0.5 $V_{DD}$, and above 0.5 $V_{DD}$.

Figure 7:
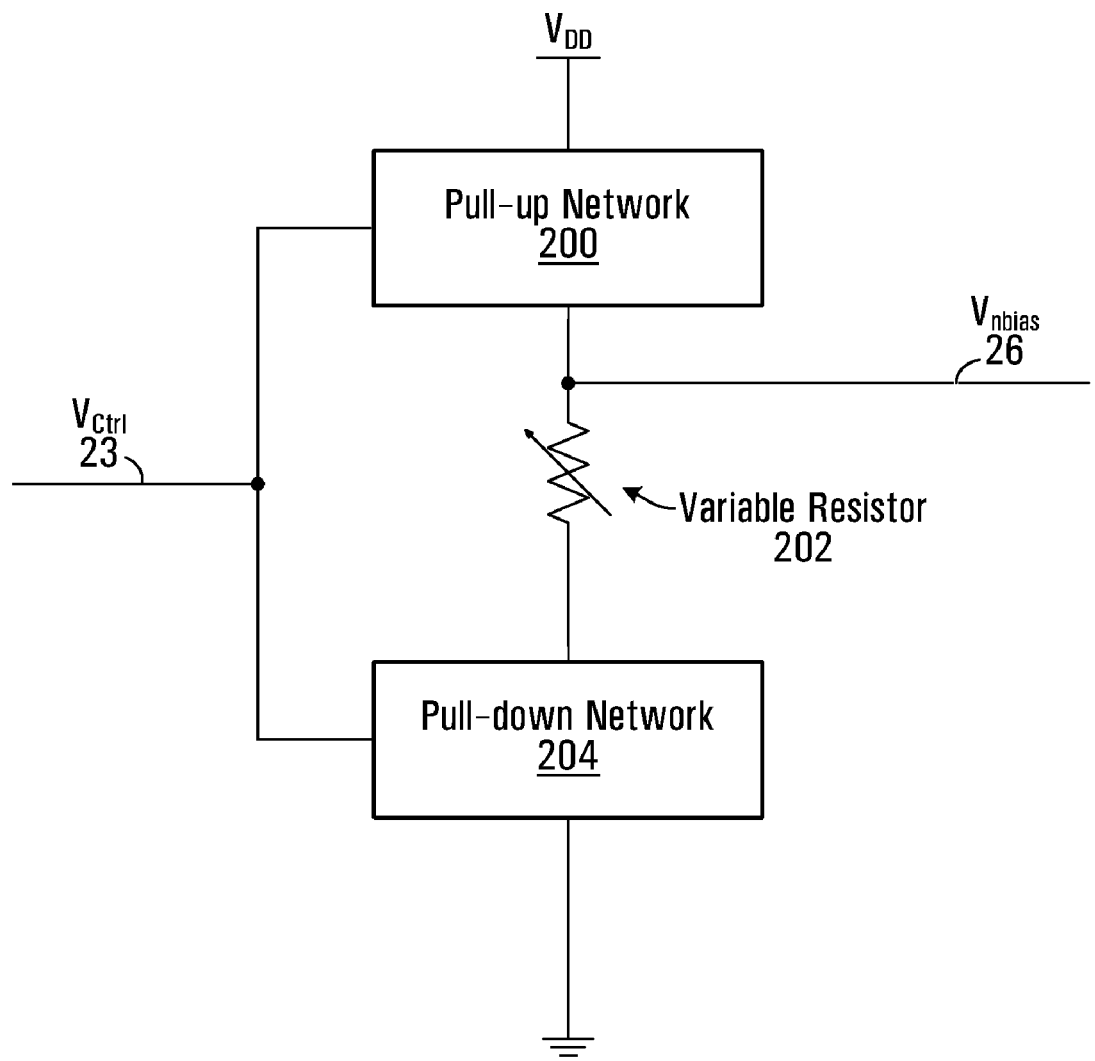
FIG. 7 is a schematic diagram of another example of a biasing circuit provided by an embodiment of the invention.

Referring now to FIG. 7, shown is a schematic diagram of another biasing network provided by an embodiment of the invention. This circuit again receives the $V_{ctrl}$ 23 input and produces a $V_{nbias}$ output 26. The input 23 is connected to a pull-up network 200 and a pull-down network 204. There is a variable resistor element 202 for impeding the pull-down network from pulling down $V_{nbias}$ 26. It can be seen that the circuit of FIG. 5 is a specific example of the FIG. 7 embodiment. Specifically, for the FIG. 5 embodiment, the pull-up network 200 is P transistor 150, the pull-down network 204 is the transistor S1 152, and the variable resistor 202 is the diode connected transistor M1 154. However, it is to be understood that other elements can be used.

In the embodiments described above, the device elements and circuits are connected to each other as shown in the figures, for the sake of simplicity. In practical applications of the present invention to semiconductor ICs and DRAM devices, elements, circuits, etc. may be connected directly to each other. As well, elements, circuits etc. may be connected indirectly to each other through other elements, circuits, etc., necessary for operation of the semiconductor ICs and DRAM devices. Thus, in actual configuration of semiconductor ICs and DRAM devices, the circuit elements and devices are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A delay locked loop comprising:
   a delay line comprising a plurality of differential delay elements having $V_{nbias}$ inputs and $V_{pbias}$ inputs;
   a biasing circuit comprising:
   an input for receiving a control voltage, and a $V_{nbias}$ output for outputting a $V_{nbias}$ voltage for input to the $V_{nbias}$ inputs of the differential delay elements, and a $V_{pbias}$ output for outputting a $V_{pbias}$ voltage for input to the $V_{pbias}$ inputs of the differential delay elements;
   a direct connection between the input and the $V_{pbias}$ output such that the $V_{pbias}$ output tracks the control voltage;
   circuitry that produces the $V_{nbias}$ voltage from the control voltage, the circuitry comprising:
   a pull-up network for pulling up the $V_{nbias}$ voltage when the control voltage is low;
   a pull-down network for pulling down the $V_{nbias}$ voltage when the control voltage is high; and
   a variable resistive element for impeding the pull-down network from pulling down the $V_{nbias}$;
   wherein the pull-up network comprises a p-type transistor having a gate connected to receive the control voltage;
   wherein the pull-down network comprises an n-type transistor having a gate connected to receive the control voltage.

2. The delay locked loop of claim 1 wherein:
   each differential delay element comprises:
   an input differential pair of transistors that receive a differential input, sources of the input differential pair connected to a drain of another transistor, the $V_{nbias}$ voltage connected to a gate of the another transistor;
   a first symmetric load element and a second symmetric load element, the first and second symmetric load elements connected to the input differential pair of transistors, and also connected to receive the $V_{pbias}$ voltage.

3. The delay locked loop of claim 2 wherein the input differential pair of transistors comprises:
   a first n-type transistor having a gate connected to receive a first end of the differential input, a source connected to a drain of the another transistor, and a drain connected to the first symmetric load element;
   a second n-type transistor having a gate connected to receive a second end of the differential input, a source connected to the drain of the another transistor, and a drain connected to the second symmetric load element.

4. The delay locked loop of claim 3 wherein the another transistor has a source connected to a first supply.

5. The delay locked loop of claim 2 wherein:
   the first symmetric load element comprises:
   a first p-type transistor and a second p-type transistor connected to form a differential pair of transistors;
   the first p-type transistor having a source, gate, and drain,
   the second p-type transistor having a source, gate, and drain,
   the drains of the first and second p-type transistors connected together and to the gate of the first p-type transistor;
   the sources of the first and second p-type transistors connected together and to a second supply voltage; and
   the gate of the second p-type transistor connected to receive the $V_{nbias}$ voltage;
   wherein the second symmetric load element comprises:
   a first p-type transistor and a second p-type transistor connected to form a differential pair of transistors;
   the first p-type transistor having a source, gate, and drain,
   the second p-type transistor having a source, gate, and drain,
   the drains of the first and second p-type transistors connected together and to the gate of the first p-type transistor;
   the sources of the first and second p-type transistors connected together and to the second supply voltage; and
   the gate of the second p-type transistor connected to receive the $V_{nbias}$ voltage.

6. The delay locked loop of claim 1 wherein the variable resistor comprises a diode connected transistor between the p-type transistor and the n-type transistor, the $V_{nbias}$ voltage being output at a drain of the p-type transistor.

7. A delay locked loop comprising:
   a delay line comprising a plurality of differential delay elements having $V_{nbias}$ inputs and $V_{pbias}$ inputs;
   a biasing circuit comprising:
   an input for receiving a control voltage, and a $V_{nbias}$ output for outputting a $V_{nbias}$ voltage for input to the $V_{nbias}$ inputs of the differential delay elements, and a $V_{pbias}$ output for outputting a $V_{pbias}$ voltage for input to the $V_{pbias}$ inputs of the differential delay elements;
   a direct connection between the input and the $V_{pbias}$ output such that the $V_{pbias}$ output tracks the control voltage;
   circuitry that produces the $V_{nbias}$ voltage from the control voltage, the circuitry comprising:
   a pull-up network for pulling up the $V_{nbias}$ voltage when the control voltage is low;
   a pull-down network for pulling down the $V_{nbias}$ voltage when the control voltage is high; and
   a variable resistive element for impeding the pull-down network from pulling down the $V_{nbias}$;
   wherein the circuitry that produces the $V_{nbias}$ voltage from the control voltage does so such that the $V_{nbias}$ voltage is near a supply voltage $V_{DD}$ over a first control voltage range, sharply declines over a second control voltage range that follows the first control voltage range, and less sharply declines in a substantially linear manner over a third control voltage range that follows the second control voltage range.

8. The delay locked loop of claim 7 wherein the first voltage range is from about 0.0V to about 0.2V, the second voltage range is from about 0.2V to about 0.4V, and the third voltage range is a range above about 0.4V.

9. The delay locked loop of claim 7 wherein each of the voltage ranges is a respective range between 0 and $V_{DD}$.

10. The delay locked loop of claim 1 comprising:
a reference clock input to a first of the differential delay elements, a last of the differential delay elements outputting a delayed clock;
a phase detector connected to receive the input clock and the delayed clock and to produce at least one control signal as a function of a phase detected;
a charge pump connected to receive the at least one control signal and connected to output the control voltage to the biasing circuit.

* * * * *